United States Patent [19]

Kitamura et al.

[11] Patent Number: 5,621,158
[45] Date of Patent: Apr. 15, 1997

[54] MEASUREMENT VALUE JUDGING METHOD

[75] Inventors: Tatsuya Kitamura; Tatsuya Ariga, both of Hiratsuka, Japan

[73] Assignee: Komatsu Ltd., Tokyo, Japan

[21] Appl. No.: 666,331

[22] PCT Filed: Dec. 6, 1994

[86] PCT No.: PCT/JP94/02043

§ 371 Date: Jun. 6, 1996

§ 102(e) Date: Jun. 6, 1996

[87] PCT Pub. No.: WO95/16226

PCT Pub. Date: Jun. 15, 1995

[30] Foreign Application Priority Data

Dec. 6, 1993 [JP] Japan .................................. 5-305369

[51] Int. Cl.$^6$ .................................................. G01R 7/10
[52] U.S. Cl. ........................................................ 73/1.01
[58] Field of Search .......................... 73/1 R, 118.1; 324/550, 537; 340/501, 661

[56] References Cited

FOREIGN PATENT DOCUMENTS

| | | |
|---|---|---|
| 62-204302 | 9/1987 | Japan . |
| 62175984 | 1/1989 | Japan . |
| 221309 | 1/1990 | Japan . |
| 2205926 | 8/1990 | Japan . |
| 511836 | 1/1993 | Japan . |

*Primary Examiner*—Robert Raevis
*Attorney, Agent, or Firm*—Baker & Daniels

[57] ABSTRACT

A measurement value judgment method for comparing measurement values from sensors provided at various locations of a system with pre-set reference values, and judging, based on the results of the comparison so made, whether the system is normal or abnormal, comprises the steps of judging a quantity of state relative to the load on the system and changing the reference values in response to the results of the judgement, the thereby judging accurately whether or not the system and sensors are in an abnormal status by accurately identifying the operating state of the system.

4 Claims, 2 Drawing Sheets

# MEASUREMENT VALUE JUDGING METHOD

TECHNICAL FIELD

The present invention relates to a measurement value judging method which judges, from the measurement values of a variety of sensors, whether the operating state of various types of systems such as a plant or a vehicle, etc. is normal or abnormal.

BACKGROUND ART

In judgement of the operating state of a plant, etc., a technology wherein output values of various sensors installed in the plant produced during normal operation are stored beforehand as reference values, sensor output values read during an actual operation are compared with these reference values in order to judge whether the sensor outputs are normal or abnormal, and results are used to judge whether the operation of the plant is normal or abnormal is widely known as a limit check method. However, since a transient state and a steady state exist in operations, it is not possible to judge abnormalities accurately if the same reference values are used for both these states. Japanese Laid-open Patent Application No. 2-114399 therefore disclosed a technology which is designed to diagnose abnormalities accurately regardless of the operating state, by automatically changing reference values in accordance with the states of plant process values.

The case where a plant is a generator and the abovementioned conventional technology is applied in abnormality diagnosis will now be considered. In FIG. 3, 1 is a generator, 2 is a voltage sensor for the generator, 3 is a rotational speed sensor for the generator, 4 indicates power supply wiring and 5 indicates various loads which receive supply of power.

With this configuration, since there is a limit (capacity) associated with the ability of the generator to supply power, if there are many loads, the voltage tends to drop and becomes insufficient for the rated voltages of the loads. In such a case, depending on the amount of power that has to be supplied to the loads 5, it can happen that the output value of, e.g., the voltage sensor is less than the normal reference value even though the generator is normal, regardless of whether the operating state is a transient state or a steady state.

In the above-described configuration, since the output values of the voltage sensor 2 and the rotational speed sensor 3 ought to be in a relation of correspondence, sensor abnormalities can be detected by comparing correspondence states of the output values of the two sensors. In the system of FIG. 3, it is assumed that a relation as indicated by formula (1) below and a sensor abnormality judgement rule (a) below apply to the output values of the two sensors.

$$V = \alpha \times R + \beta \quad (1)$$

$$\text{if } r1 \leq R \leq r2 \text{ then } v1 \leq V \leq v2 \quad (a)$$

V: voltage
R: rotational speed
$\alpha, \beta$: constants

In this case, regardless of whether the operation is in a transient state or in a steady state, if the total amount of power that has to be supplied to the loads 5 exceeds the supply upper limit of the generator 1, then it is judged by the rule (a) that a sensor abnormality has occurred on the grounds that "although the rotational speed is between r1 and r2, the voltage value is less than v1.", even though the sensors are normal.

Thus, with the above-described conventional technology, there is the problem that, since the states of system load are not taken into consideration, it is not possible to judge system or sensor abnormalities accurately.

With the foregoing in view, it is an object of the present invention to provide a measurement value judging method which makes it possible to gain an accurate apperception of system operating states and to make accurate system and sensor abnormality judgement.

DISCLOSURE OF THE INVENTION

In this invention, a measurement value judging method in which comparison is made between measurement values of sensors provided in various locations in a system and previously set reference values, and judgement is made as to whether the system is normal or abnormal on the basis of results of the comparison, comprises the steps of making judgement of state quantities corresponding to loads in the system, and altering the reference values in accordance with results of the judgement.

According to this invention, reference values for comparison and judgement are altered in accordance with the system loads.

Since, according to this invention, the arrangement is thus made such that reference values for comparison and judgement are altered in accordance with loads, it is possible to gain a more accurate appreciation of system states and hence to perform accurate abnormality judgement.

Further, in this invention, a measurement value judging method in which judgement as to whether sensors provided in various locations in a system are normal or abnormal is made by using a predetermined comparison and judgement rule which uses measurement values of the sensors, comprises the steps of making judgement of state quantities corresponding to the loads of the system, and altering the comparison and judgement rule in accordance with results of the judgement.

According to this invention, a comparison and judgement rule itself is altered in accordance with the system loads.

Since, according to this invention, the arrangement is made such that a comparison and judgement rule for judging sensor abnormalities is altered in accordance with the system loads, abnormalities of the sensors themselves can be judged more accurately.

BEST MODE FOR CARRYING OUT THE INVENTION

This invention will now be described in detail by means of the embodiment thereof illustrated in the accompanying drawings.

Figure 1:
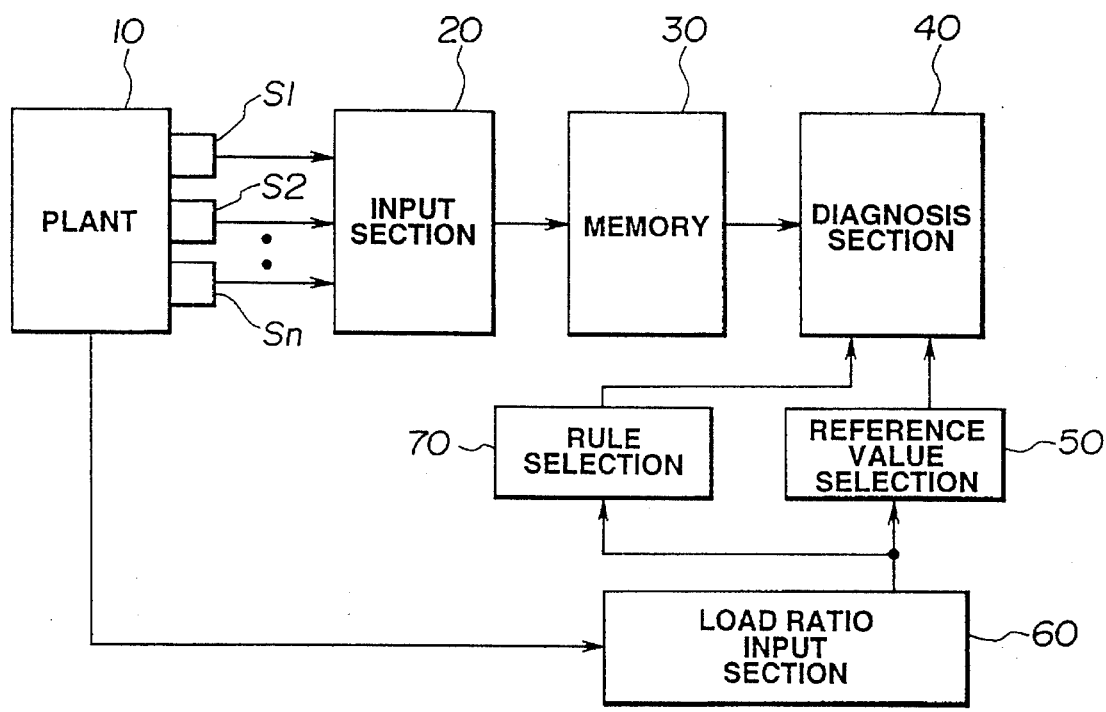
FIG. 1 is a block diagram showing an embodiment of this invention.

FIG. 1 shows an embodiment of this invention in which various types of sensors S1–Sn are provided in a plant 10, and various states of the plant 10 are detected by sensors S1–Sn. The measurement values of the sensors S1–Sn are input via an input section 20 into a memory section 30 and stored therein.

A load ratio which is detected on the plant 10 side or is set each time by an operator, is input into a load ratio input section 60. The load ratio is defined as the ratio of the current load to the maximum rated load. The load ratio which has been input into the load ratio input section 60 is input into a reference value selecting section 50 and a rule selecting section 70.

The reference value selecting section 50 is preloaded with a plurality of different reference values for respective sensors S1–Sn in accordance with the load ratio.

Figure 2:
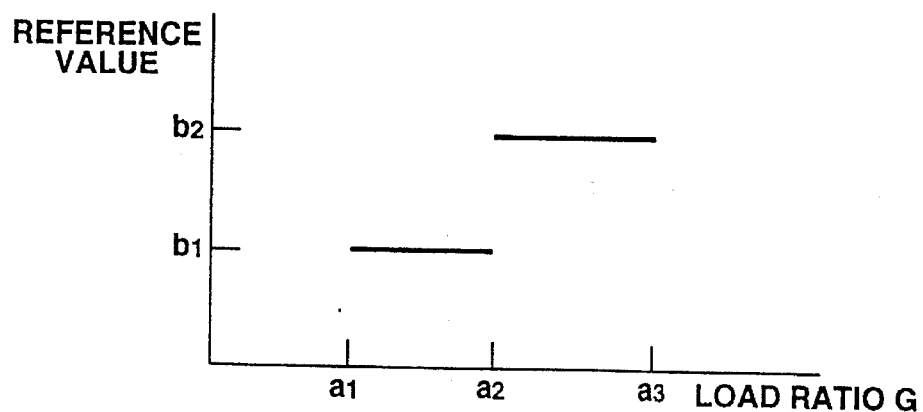
FIG. 2 is a graph showing details of reference value alterations.
Figure 3:
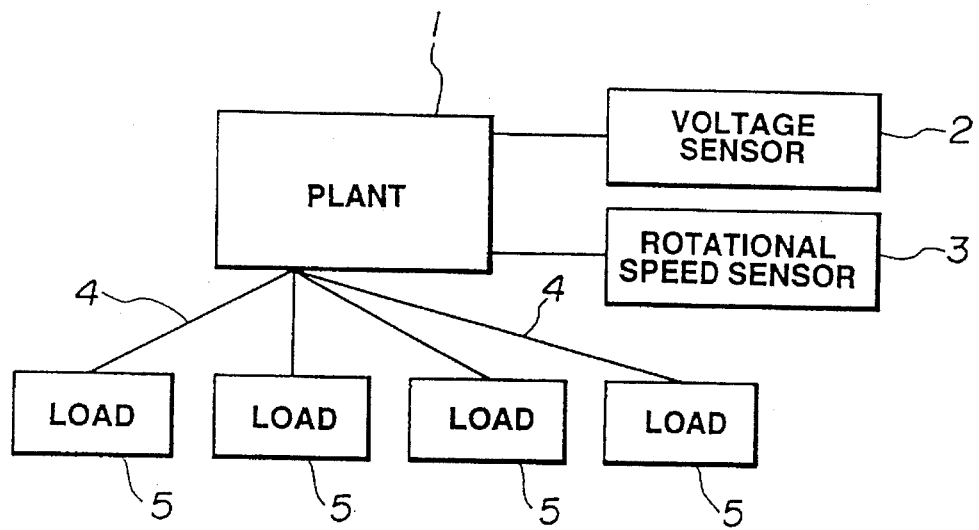
FIG. 3 is a drawing used for describing problems in conventional technology.

FIG. 2 shows one example of a memory table of reference values that relate to one sensor. In this case, the reference value is made b1 when the load ratio G is $a1 \leq G \leq a2$, and is made b2 when the load ratio G is $a2 \leq G \leq a3$. The reference values for other sensors are made respective different values in correspondence to different load ratios.

Reference values for respective sensors corresponding to the load ratios G at various points of time that are input from the load ratio input section 60 are selected by the reference value selecting section 50, and the selected reference values are output to a diagnosis section. 40.

A plurality of abnormality diagnosis rules which relate to abnormality diagnosis rules between different sensors are set beforehand in the rule selecting section 50 in correspondence to the load ratios. The abnormality diagnosis rule between a voltage sensor and a rotational speed sensor is given as follows.

When $c1 \leq$ load ratio $\leq c2$, $$V = \alpha 1 \times R + \beta 1$$

if $r1 \leq R \leq r2$ then $v1 \leq V \leq v2$     (i)

When $c2 \leq$ load ratio $\leq c3$, $$V = \alpha 2 \times R + \beta 2$$

if $r1 \leq R \leq r2$ then $v3 \leq V \leq v4$     (ii)

V: voltage
R: rotational speed
$\alpha i, \beta i$: constants (i=1,2)
ri, vj : reference values (j=1–4)

The rule selecting section 70 stores respective abnormality diagnosis rules such as above for each type of sensor, selects an abnormality diagnosis rule that corresponds to the load ratios of different points of time that are input from the load ratio input section 60, and output the selected abnormality diagnosis rule to the diagnosis section 40.

The diagnosis section 40 performs comparison and judgement processing in which the reference values input from the reference value selecting section 50 are compared with the respective sensor measurement values that are read from the memory section 30 and judges whether the system is normal or abnormal. The diagnosis section 40 also performs judgement of abnormalities of the various sensors by conducting abnormality diagnosis in respect of the measurement values of the sensors that are read from the memory section 30 in accordance with the abnormality diagnosis rules that are input from the rule selecting section 70.

Although the load ratio is used as a state quantity representing the load in the embodiment, loads may also be judged on the basis of other state quantities.

Also, the procedure for changing reference values is not restricted to that shown in FIG. 2, but any procedure may be employed. Further, the arrangement may be such that the contents of comparison and judgement rules are altered in the rule selecting section 70.

Further, although the arrangement is made such that a plurality of reference values are stored in the reference value selecting section 50 and selected reference values are output to the diagnosis section 40 in the embodiment, the arrangement may also be that a plurality of reference values are stored in the diagnosis section 40, and the reference value selecting section 50 outputs to the diagnosis section 40 selection signals for causing selections to be made from among the plurality of reference values. The same also applies in connection with the rule selecting section 70, and the arrangement may be that a plurality of different diagnosis rules are stored in correspondence to loads in the diagnosis section, and the rule selecting section 70 outputs relevant selection signals to the diagnosis section 40.

INDUSTRIAL APPLICABILITY

This invention can be used in technology for judging whether the operating state of various types of system such as a plant or a vehicle, etc. is normal or abnormal.

We claim:

1. A measurement value judging method in which comparison is made between measurement values of sensors provided in various locations in a system and previously set reference values, and judgement is made as to whether the sensors are normal or abnormal on the basis of results of the comparison, comprising the steps of:

detecting state quantities corresponding to loads of the system, and altering normal operation ranges of the sensors in accordance with results of the detection.

2. A measurement value judging method as claimed in claim 1, wherein a plurality of different normal operation ranges for the respective sensors are stored beforehand in correspondence to state quantities corresponding to loads, and a normal operation range of a sensor is altered by selecting one of the plurality of the stored normal operation ranges in accordance with results of the detection of the state quantities.

3. A measurement value judging method as claimed in claim 2, wherein the state quantities corresponding to loads are load ratios.

4. A measurement value judging method as claimed in claim 1, wherein the state quantities corresponding to loads are load ratios.

\* \* \* \* \*